United States Patent
Hung et al.

(10) Patent No.: US 7,489,510 B1
(45) Date of Patent: Feb. 10, 2009

(54) FASTENING DEVICE FOR MOUNTING THERMAL MODULE TO ELECTRONIC COMPONENT

(75) Inventors: Jui-Wen Hung, Taipei Hsien (TW); Cheng-Jen Liang, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/964,905

(22) Filed: Dec. 27, 2007

(51) Int. Cl.
*H05K 7/20* (2006.01)
*F28F 7/00* (2006.01)

(52) U.S. Cl. .............. 361/700; 165/80.2; 165/104.33; 361/695; 361/719

(58) Field of Classification Search ............ 165/104.33; 361/700
See application file for complete search history.

(56) References Cited

U.S. PATENT DOCUMENTS

| 6,567,269 | B2* | 5/2003 | Homer et al. | 361/700 |
| 6,625,021 | B1* | 9/2003 | Lofland et al. | 361/697 |
| 6,865,082 | B2* | 3/2005 | Huang et al. | 361/700 |
| 6,966,363 | B2* | 11/2005 | Gailus et al. | 165/185 |
| 7,269,014 | B1* | 9/2007 | Zhao et al. | 361/700 |
| 7,327,574 | B2* | 2/2008 | Frank et al. | 361/711 |
| 7,382,621 | B2* | 6/2008 | Peng et al. | 361/719 |
| 7,405,937 | B1* | 7/2008 | Wang et al. | 361/700 |
| 7,414,850 | B2* | 8/2008 | Hung | 361/719 |
| 2006/0260787 | A1* | 11/2006 | Wu et al. | 165/104.33 |
| 2007/0251675 | A1* | 11/2007 | Hwang et al. | 165/104.33 |
| 2008/0035311 | A1* | 2/2008 | Hsu | 165/104.21 |
| 2008/0043436 | A1* | 2/2008 | Hung et al. | 361/700 |

* cited by examiner

Primary Examiner—Gregory D Thompson

(57) ABSTRACT

A thermal module includes a heat sink (400), a heat pipe (200) and a fastening device (300). The heat pipe (200) includes an evaporator (240) and a condenser (220) connected with the heat sink. The fastening device includes a base member (320) and a spring member (340). The base member includes a contacting plate (322) and two locating pins (324). Each locating pin includes a head portion (3240) and a neck portion (3244). The spring member includes a pressing portion (342) pressing the evaporator towards the contacting plate. Two locating holes (348) are defined in the pressing portion. The spring member is mounted on the base member via engagement of the locating holes with the locating pins. The spring member has a thickness smaller than a length of each of the neck portions and is movable along the neck portions to suit for a size of the evaporator.

18 Claims, 5 Drawing Sheets

FASTENING DEVICE FOR MOUNTING THERMAL MODULE TO ELECTRONIC COMPONENT

Relevant subject matter is disclosed in a pending U.S. patent application Ser. No. 11/308,729, filed on 2006 Apr. 26, and entitled "fastening device for mounting a thermal module to an electronic component", which is assigned to the same assignee as this application and which is hereby fully incorporated by reference.

BACKGROUND OF THE INVENTION

1. Field of the Invention

The present invention relates to a fastening device, and particularly to a fastening device for mounting a thermal module onto a heat-generating component.

2. Description of Related Art

FIG. 5 illustrates a conventional thermal module 30. The thermal module 30 includes a die-casting member 31, a heat pipe 32, a fin assembly 33 and a strip-like spring member 34. The die-casting member 31 has a bottom surface contacting with a heat-generating component (not shown) mounted on a printed circuit board (not shown). The heat pipe 32 includes an evaporator section received in a channel 312 of the die-casting member 31, and a condenser section contacted with the fin assembly 33. The spring member 34 includes a middle portion, and two ends for being attached to the printed circuit board. When the ends of the spring member 34 are attached to the printed circuit board via screws (not shown) extending through mounting holes 342 defined in the spring member 34, through holes 341 of the spring member 34 engage with posts 311 of the die-casting member 31 and the spring member 34 urges the die-casting member 31 towards the printed circuit board to mount the thermal module 30 thereon, whereby the die-casting member 31 can have an intimate contact with the heat-generating component mounted on the printed circuit board.

However, the channel 312 is defined in a central portion of the die-casting member 31 and the heat pipe 32 is usually mounted in the channel 312 via soldering. When the heat pipe 312 is inserted into the channel 312, the solder spread on the channel 312 will be scraped off. As a result, the heat resistance between the heat pipe 32 and the die-casting member 31 is greatly increased. Furthermore, if the heat pipe 32 has a size larger than that of the channel 312 due to machining tolerance, it is difficult to insert the heat pipe 32 into the channel 312.

What is needed, therefore, is a thermal module with a lower heat resistance and a good universality of application.

SUMMARY OF THE INVENTION

In accordance with an embodiment of the present invention, a thermal module comprises a heat sink, a heat pipe and a fastening device. The heat pipe comprises an evaporator configured for thermally connecting with a heat-generating component mounted on a top side of a printed circuit board, and a condenser connected with the heat sink. The fastening device comprises a base member and a spring member. The base member comprises a contacting plate and two locating pins. The contacting plate has a bottom surface for contacting with the heat-generating component and a top surface for supporting the evaporator thereon. The locating pins extend upwardly from the contacting plate and the evaporator is positioned between the locating pins. Each locating pin comprises a head portion and a neck portion. The spring member comprises a pressing portion directly pressing the evaporator towards the contacting plate, and two ears formed on ends of the spring member. The ears are configured for attaching the spring member to the printed circuit board. Two locating holes are defined in the pressing portion and align with the locating pins respectively. The locating holes each have a diameter larger than that of the neck portion but smaller than that of the head portion. The spring member is detachably mounted on the base member via engagement of the locating holes with the locating pins. The spring member has a thickness smaller than a length of each of the neck portions along an extension direction of the locating pins, so that the spring member is movable along the neck portions to suit for a size of the evaporator.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
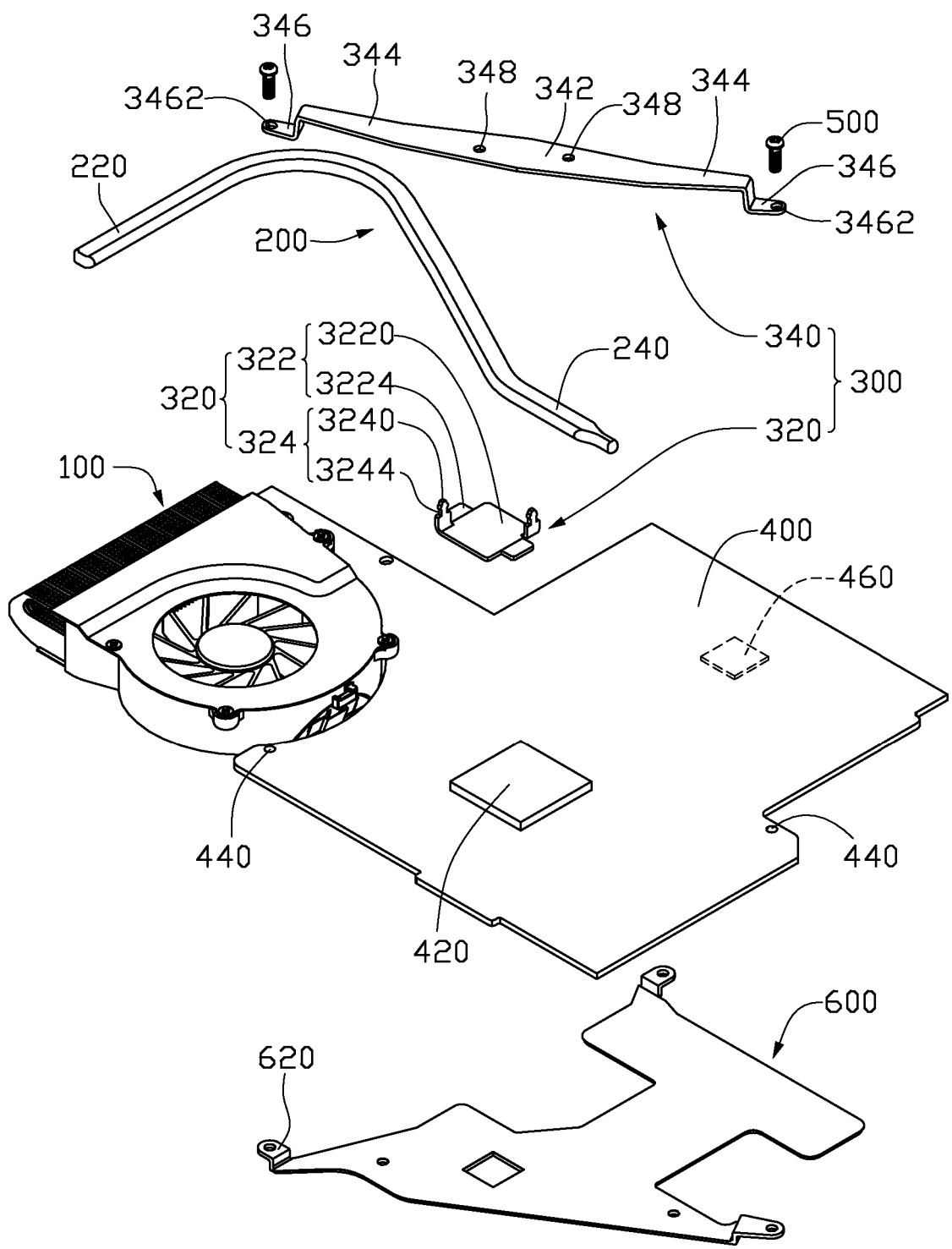
FIG. 1 is an exploded view of a thermal module in accordance with a preferred embodiment of the present invention.
Figure 2:
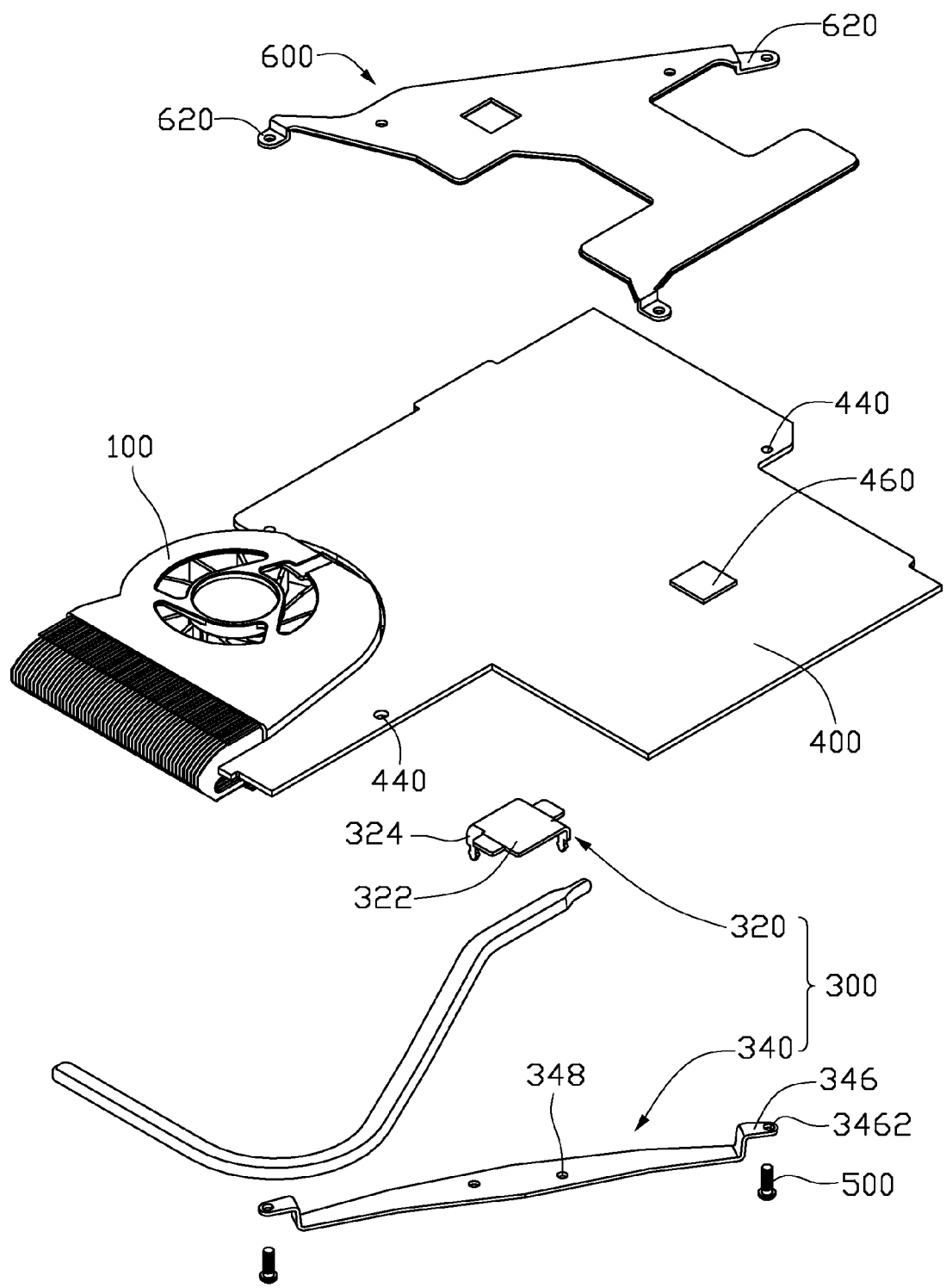
FIG. 2 is similar to FIG. 1, but viewed from another aspect.
Figure 3:
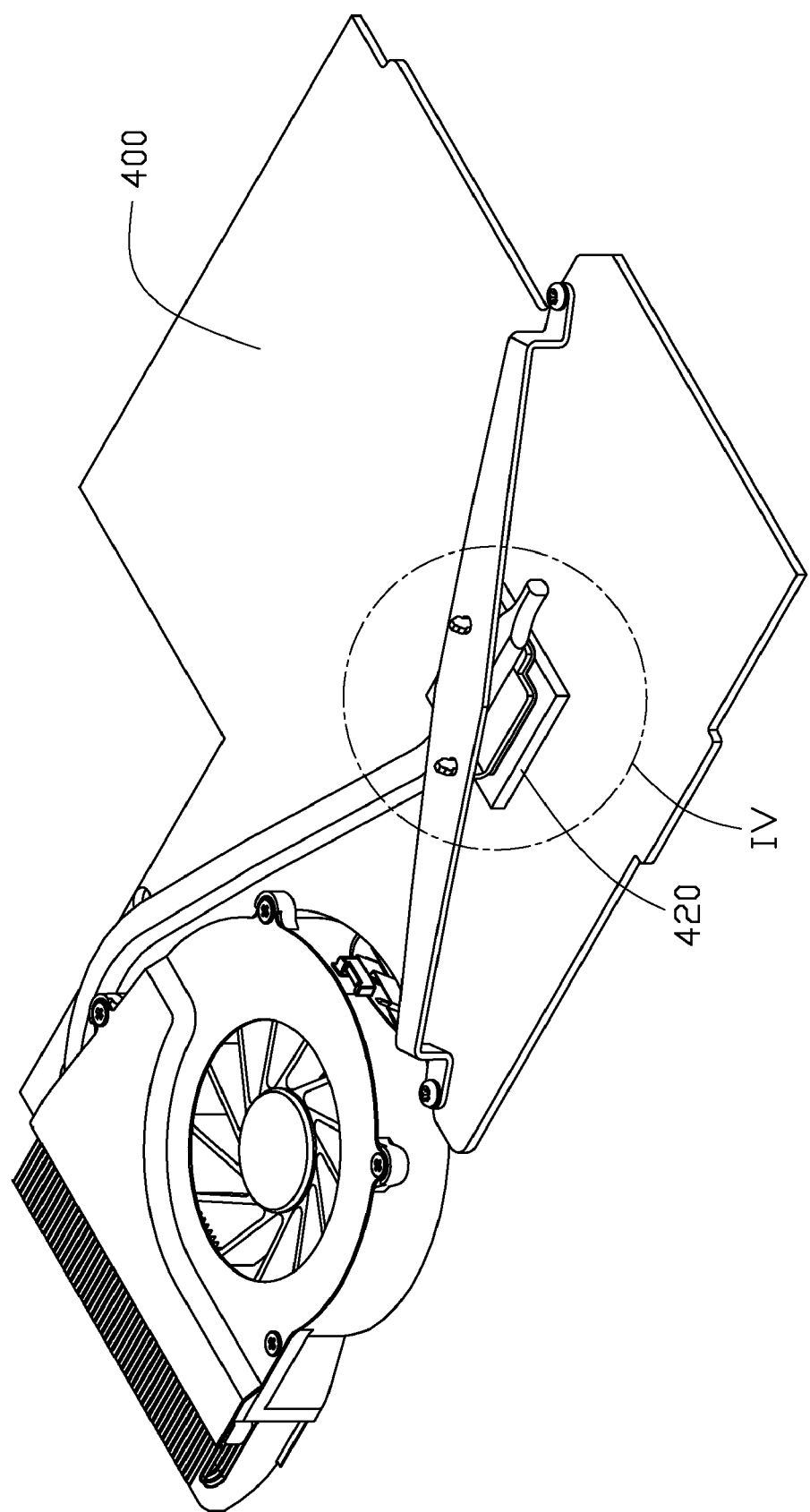
FIG. 3 is an assembled view of FIG. 1.
Figure 4:
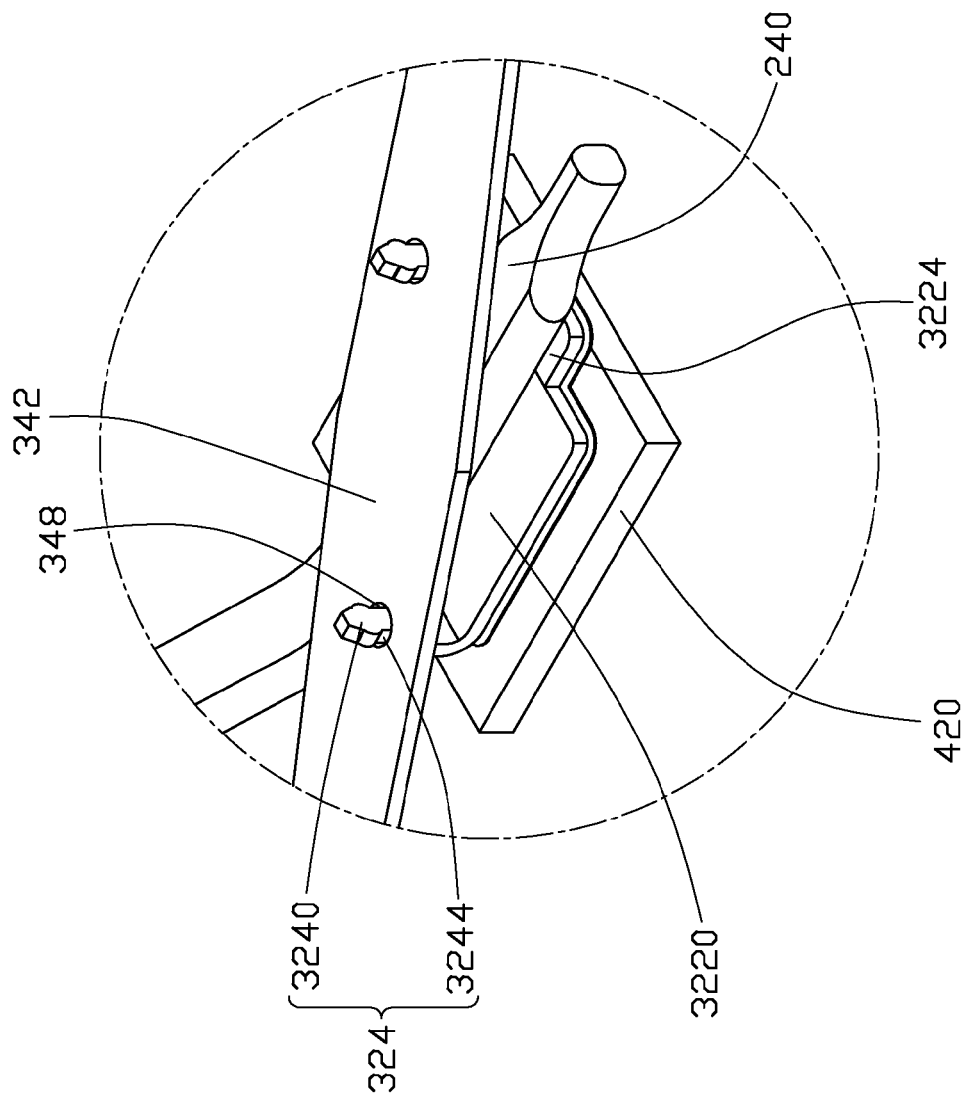
FIG. 4 is an enlarged view of a circled part IV of FIG. 3.
Figure 5:
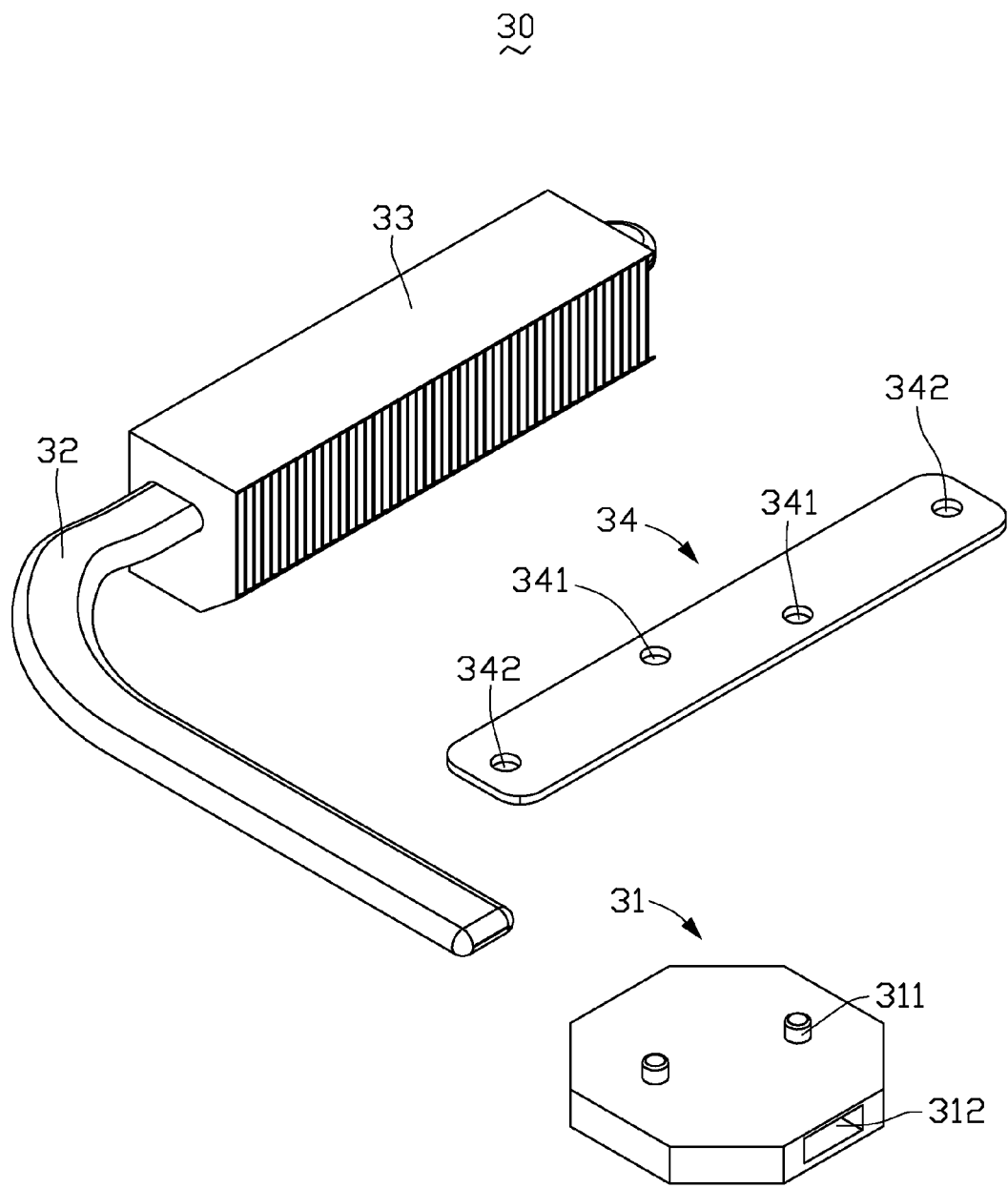
FIG. 5 is an exploded view of a thermal module in related art.

Referring to FIGS. 1-4, a thermal module according to a preferred embodiment of the invention is illustrated. The thermal module includes a heat sink 100, a heat pipe 200 and a fastening device 300. The heat sink 100 is positioned at a lateral side of a printed circuit board 400. The heat pipe 200 generally has an L-shaped profile, and includes a condenser 220 retained in the heat sink 100, and an evaporator 240 engaged with the fastening device 300.

The fastening device 300 includes a base member 320 and a strip-like spring member 340 detachably engaged with the base member 320. The base member 320 is provided for contacting with a heat-generating component 420 mounted on a top side of the printed circuit board 400 and receiving the heat pipe 200 therein. The spring member 340 is provided for mounting the base member 320 to the printed circuit board 400 whereby the base member 320 can have an intimate contact with the heat-generating component 420. The detailed structure of the fastening device 300 will be described below.

The base member 320 is stamped from a metal sheet, and includes a cross-shaped contacting plate 322 and two locating pins 324 perpendicularly formed upwardly from the contacting plate 322. The contacting plate 322 includes a heat-absorbing plate 3220 and two wings 3224 intercrossed with the heat-absorbing plate 3220.

The locating pins 324 are formed at diagonal corners of the heat-absorbing plate 3220 with the two wings 3224 each neighboring one of the locating pins 324. In other words, the wings 3224 and the heat-absorbing plate 3220 together define a road between the two locating pins 324 to support the evaporator 240 thereon. Preferably, each wing 3224 has a width equal to a width of the evaporator 240. By such a design, when the evaporator 240 is positioned on the heat-absorbing plate 3220, the locating pins 324 abut against opposite lateral sides of the evaporator 240.

Each locating pin 324 includes a head portion 3240 formed at a free end thereof and a neck portion 3244 below the head portion 3240. The head portion 3240 has a diameter larger than that of the neck portion 3244.

The spring member 340 has a pressing portion 342, and two arms 344 slantways extending upwardly from opposite ends of the pressing portion 342. An L-shaped ear 346 is formed at a free end of each arm 344. The ear 346 is formed by bending an end of each arm 344 downwardly and then horizontally. Each ear 346 has a mounting hole 3462 defined therein.

Two spaced locating holes 348 are defined in the pressing portion 342 corresponding to the locating pins 324. The locating holes 348 each have a diameter larger than that of the neck portion 3244 but smaller than that of the head portion 3240. By such a design, the locating holes 348 of the spring member 340 can slide past the head portions 3240 via elastic deformation of the head portions 3240 until the spring member 340 is held at the neck portions 3244.

Preferably, the spring member 340 has a thickness smaller than a length of each of the neck portions 3244 along an extension direction of the locating pins 324. Therefore, the spring member 340 can freely move upwardly or downwardly along the neck portions 3244 so as to suit for heat pipes with different diameters.

In assembly of the thermal module, the evaporator 240 of the heat pipe 200 is first disposed on the heat-absorbing plate 3220 and the wings 3224 with the locating pins 324 clamping at the opposite lateral sides of the evaporator 240.

Then, the spring member 340 is mounted on the base member 320 with the locating pins 324 extending through the locating holes 348 of the spring member 340 via elastic deformation of the head portions 3240. The head portions 3240 extend above the spring member 340 and return to their original shapes. As a result, the spring member 340 is held at the neck portions 3244. Thus, the thermal module is pre-assembled prior to being mounted on the printed circuit board 400. In this process, when a diameter of the evaporator 240 of the heat pipe 200 is changed in a certain range, the spring member 340 can be drive to move upwardly or downwardly along the neck portion 3244 to suit for the evaporator 240 of the heat pipe 200. Therefore, the thermal module has a good universality of application.

Finally, the mounting holes 3462 of the spring member 340 are aligning with associate screw holes 440 of the printed circuit board 400, and fasteners 500 are extended through the mounting holes 3462 of the spring member 340 and screwed into screw holes 440 of the printed circuit board 400. The spring member 340 is deformed to cause the pressing portion 342 to urge the evaporator 240 towards the heat-absorbing plate 3220. Thus, the spring member 340 exerts a downward force on the base member 320 to fix the base member 320 and the heat pipe 200 on the printed circuit board 400. In this process, when the mounting holes 3462 of the spring member 340 can not align with the associate screw holes 440 of the printed circuit board 400 due to machining tolerance, the L-shaped ear 346 can be bent inward or outward to cause the mounting hole 3462 of the spring member 340 to align with the screwed holes 440 of the printed circuit board 400.

By the presence of the L-shaped ear 346, the requirement of machining precision of the screwed holes 440 of the printed circuit board 400 and the spring member 340 can be reduced. Thus, the thermal module has a lower cost and a good universality of application.

For making sure that the evaporator 240 is firmly mounted on the base member 320, a layer of solder such as tin paste, can be spread on the base member 320. Then the evaporator 240 is firmly mounted on the base member 320 via soldering.

For dissipating heat of an electronic component 460 mounted on a bottom side of the printed circuit board 400, a base plate 600 is attached to the bottom side of the printed circuit board 400. The base plate 600 comprises three mounting ears 620 defined at corners thereof. Fasteners (not shown) such as screws are pushed to extend through the mounting ears 620 and threadedly engage with the printed circuit board 400 so as to mount the base plate 600 on the printed circuit board 400.

Preferably, two of the mounting ears 620 are arranged to align with the mounting holes 3462 of the spring member 340. The fasteners 500 are extended through the mounting holes 3462 of the spring member 340 and the screw holes 440 of the printed circuit board 400 to screw into the mounting ears 620. As a result, the base plate 600 and the spring member 340 are mounted at opposite sides of the printed circuit board 400 via the fasteners 500.

For facilitating assembly of the spring member 340 and the base member 320, the spring member 340 can be made of a material which has a rigidity larger than that of the base member 320. For example, the spring member 340 can be made of steel, and the base member 320 can be made of aluminum or copper.

As mentioned above, the evaporator 240 is mounted on the base member 320 via engagement of the locating holes 348 of the spring member 340 with the locating pins 324. Thus, the process of assembly of the thermal module is simplified, thereby reducing the cost of the thermal module.

Furthermore, a layer of solder can be easily spread on the base member 320 and the evaporator 240 can be directly disposed on the base member 320 without scraping off the solder. Therefore, the evaporator 240 can have an intimate contact with the base member 320. The heat resistance between the evaporator 240 and the base member 320 is greatly decreased compared with the thermal module 30 of the related art.

Additionally, the base member 320 of the fastening device 300 is stamped from a metal sheet, and is lighter than the die-casting member 31 of the related art. Thus, the weight of the thermal module is decreased.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fastening device configured for mounting a heat pipe to a heat-generating component, the fastening device comprising:
   a base member comprising a contacting plate for contacting with the heat-generating component, and two locating pins extending upwardly from the contacting plate in such a manner that the heat pipe is disposed on the contacting plate with the locating pins clamping at opposite lateral sides of the heat pipe, respectively, each pin having a head portion and a neck portion below the head portion; and a spring member comprising two ends configured for being attached to a board with the heat-generating component mounted thereon, and a middle portion having two locating holes aligning with the locating pins, respectively;

wherein the spring member is held at the neck portions after the head portions of the locating pins extend through the locating holes of the spring member; thereby sandwiching the heat pipe between the middle portion of the spring member and the contacting plate.

2. The fastening device as described in claim 1, wherein the spring member is detachably mounted on the base member.

3. The fastening device as described in claim 1, wherein the contacting plate includes a heat-absorbing plate and two wings intercrossed with the heat-absorbing plate, and the locating pins are formed at diagonal corners of the heat-absorbing plate with the two wings each neighboring one of the locating pins.

4. The fastening device as described in claim 3, wherein the wings and the heat-absorbing plate together define a road between the locating pins to support the heat pipe thereon.

5. The fastening device as described in claim 1, wherein each end of the spring member has an arm slantways extending upwardly from an end of the middle portion.

6. The fastening device as described in claim 5, wherein an L-shaped ear is formed at an end of each of the arms.

7. The fastening device as described in claim 1, wherein the spring member is made of a material which has a rigidity larger than that of the base member.

8. The fastening device as described in claim 1, wherein a layer of solder is spread on the contacting plate, and the heat pipe is mounted on the base member via soldering.

9. The fastening device as described in claim 1, wherein the spring member has a thickness smaller than a length of each of the neck portions along an extension direction of the locating pins, so that the spring member is movable along the neck portions.

10. A thermal module comprising:

a heat sink;

a heat pipe comprising an evaporator configured for thermally connecting with a heat-generating component mounted on a top side of a printed circuit board, and a condenser connected with the heat sink; and a fastening device configured for mounting the evaporator to the heat-generating component, comprising:

a base member comprising a contacting plate and two locating pins; the contacting plate having a bottom surface for contacting with the heat-generating component and a top surface for supporting the evaporator thereon; the locating pins extending upwardly from the contacting plate and the evaporator being positioned between the locating pins; each locating pin comprising a head portion and a neck portion; and a spring member comprising a pressing portion directly pressing the evaporator towards the contacting plate, and two ears formed on ends of the spring member, the ears configured for attaching the spring member to the printed circuit board; two locating holes defined in the pressing portion and aligning with the locating pins respectively;

wherein the locating holes each have a diameter larger than that of the neck portion but smaller than that of the head portion, and the spring member is detachably mounted on the base member via engagement of the locating holes with the locating pins; and wherein the spring member has a thickness smaller than a length of each of the neck portions along an extension direction of the locating pins, so that the spring member is movable along the neck portions to suit for a size of the evaporator.

11. The thermal module as described in claim 10, wherein the contacting plate includes a heat-absorbing plate and two wings intercrossed with the heat-absorbing plate, and the locating pins are formed at diagonal corners of the heat-absorbing plate with the two wings each neighboring one of the locating pins.

12. The thermal module as described in claim 11, wherein the wings and the heat-absorbing plate together define a road between the two locating pins to support the evaporator.

13. The thermal module as described in claim 10, wherein the spring member is made of a material which has a rigidity larger than that of the base member.

14. The thermal module as described in claim 10, wherein a layer of solder is spread on the contacting plate, and the evaporator is mounted on the base member via soldering.

15. The thermal module as described in claim 10, further comprising a base plate attached to a bottom side of the printed circuit board, the base plate having a plurality of mounting ears for attaching the base plate to the printed circuit board.

16. The thermal module as described in claim 15, wherein two of the mounting ears align with the ears of the spring member, and fasteners are extended through the ears of the spring member and the printed circuit board to engage with the two of the mounting ears.

17. The thermal module as described in claim 10, wherein the heat sink is disposed at a lateral side of the printed circuit board.

18. The thermal module as described in claim 10, wherein the ears of the spring member having an L-shaped profile.

* * * * *